US006759853B2

(12) United States Patent
Butler

(10) Patent No.: US 6,759,853 B2
(45) Date of Patent: Jul. 6, 2004

(54) AUTOMATED DOMAIN REFLECTOMETRY TESTING SYSTEM

(76) Inventor: Brian D. Butler, 4208 Balloon Park Rd. NE., Albuquerque, NM (US) 87109

( * ) Notice: Subject to any disclaimer, the term of this patent is extended or adjusted under 35 U.S.C. 154(b) by 0 days.

(21) Appl. No.: 09/738,044

(22) Filed: Dec. 15, 2000

(65) Prior Publication Data

US 2002/0075009 A1 Jun. 20, 2002

Related U.S. Application Data

(60) Provisional application No. 60/170,915, filed on Dec. 15, 1999, and provisional application No. 60/203,501, filed on May 11, 2000.

(51) Int. Cl.[7] .......................... G01R 31/11; G01R 31/02
(52) U.S. Cl. ...................................... 324/534; 324/754
(58) Field of Search ................. 324/124, 532, 324/533–535, 537, 552, 754, 642–643, 757, 761

(56) References Cited

U.S. PATENT DOCUMENTS

| | | | |
|---|---|---|---|
| 4,593,820 A | 6/1986 | Antonie et al. ............ 209/573 |
| 4,628,464 A | 12/1986 | McConnell ................ 364/513 |
| 4,740,746 A | * 4/1988 | Pollock et al. ............. 324/761 |
| 4,881,863 A | 11/1989 | Braginsky .................. 414/225 |
| 5,043,910 A | 8/1991 | Chiba ........................ 364/489 |
| 5,105,147 A | 4/1992 | Karasikov et al. ....... 324/158 F |
| 5,291,129 A | * 3/1994 | Kazama ..................... 324/757 |
| 5,394,348 A | 2/1995 | Abe ........................... 364/580 |
| 5,469,064 A | 11/1995 | Kerschner et al. ......... 324/537 |
| 5,471,148 A | * 11/1995 | Sinsheimer et al. ........ 324/754 |
| 5,498,964 A | * 3/1996 | Kerschner et al. ......... 324/530 |
| 5,498,965 A | * 3/1996 | Mellitz ...................... 324/532 |
| 5,631,562 A | * 5/1997 | Cram et al. ................ 324/333 |
| 5,631,856 A | 5/1997 | Keller et al. ............... 364/578 |
| 5,633,801 A | * 5/1997 | Bottman ...................... 702/65 |
| 5,696,450 A | 12/1997 | Itoh .......................... 324/537 |
| 5,781,021 A | 7/1998 | Ilani ......................... 324/754 |
| 5,844,412 A | 12/1998 | Norton ....................... 324/548 |
| 5,994,909 A | 11/1999 | Lucas et al. ............... 324/754 |
| 6,008,636 A | 12/1999 | Miller et al. ............. 324/158.1 |
| 6,024,526 A | 2/2000 | Slocum et al. ......... 414/226.01 |
| 6,051,978 A | * 4/2000 | Swart ........................ 324/537 |
| 6,191,601 B1 | * 2/2001 | Swart ........................ 324/761 |

FOREIGN PATENT DOCUMENTS

EP          0 953 844 A2      3/1999

OTHER PUBLICATIONS

Maury Microwave Corporation advertisment for "Quick Test" precision adapters, Jan. 21, 2000.

* cited by examiner

Primary Examiner—Evan Pert
Assistant Examiner—Paresh Patel
(74) Attorney, Agent, or Firm—Dennis F. Armijo

(57) ABSTRACT

A robotic domain reflectometry test system (and corresponding method) comprising: domain reflectometry instrumentation; a robotic arm; and a passive, high frequency probe assembly comprising a signal probe and a ground probe having a fixed, non-adjustable pitch, the probe assembly being electrically connected to the domain reflectometry instrumentation, and being moved, electrically connected to, and retracted from test points on an electrical component to be tested by the robotic arm.

14 Claims, 14 Drawing Sheets

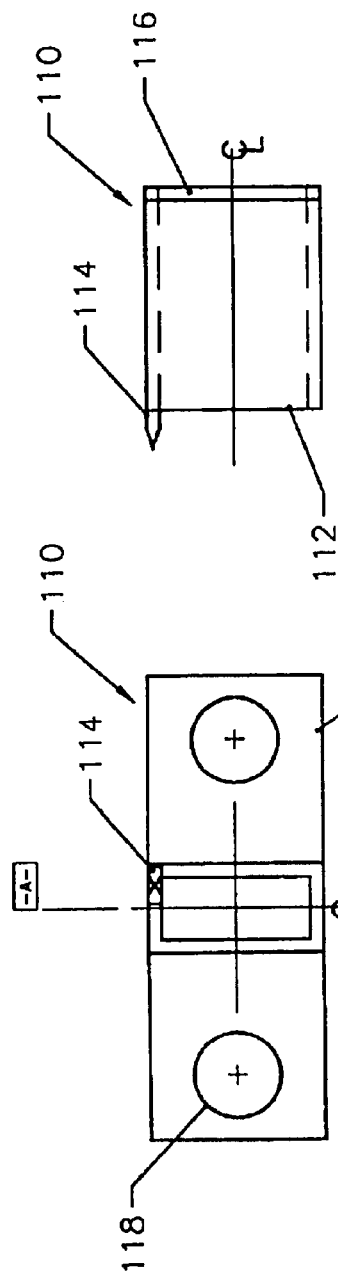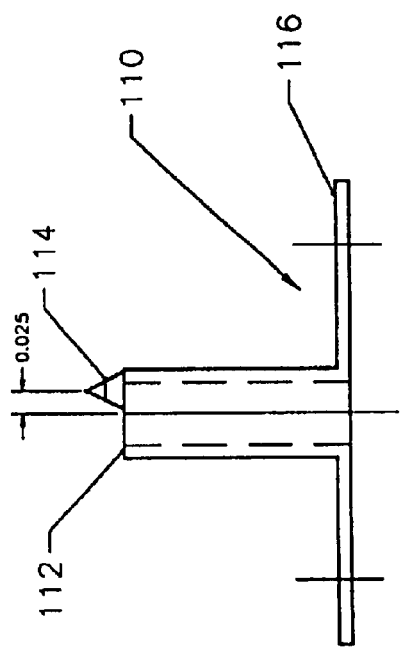
FIG. 5(d)
FIG. 5(b)
FIG. 5(c)

AUTOMATED DOMAIN REFLECTOMETRY TESTING SYSTEM

CROSS-REFERENCE TO RELATED APPLICATIONS

This application claims the benefit of the filing of U.S. Provisional Patent Application Ser. No. 60/170,915, entitled "Automated TDR Measurement", filed on Dec. 15, 1999, and of U.S. Provisional Patent Application Ser. No. 60/203,501, entitled "Wide-Bandwidth Coaxial Probe for Automated Testing of Planar Transmission Line Structures", filed on May 11, 2000, and the specifications thereof are incorporated herein by reference.

BACKGROUND OF THE INVENTION

1. Field of the Invention (Technical Field)

The present invention relates to automated domain reflectometry testing of electrical components.

2. Background Art

Note that the following discussion refers to publications that due to recent publication/filing dates are not to be considered as prior art vis-a-vis the present invention. Discussion of such publications herein is given for more complete background and is not to be construed as an admission that such publications are prior art for patentability determination purposes.

The complexity of electronic components, particularly printed circuit boards, is steadily increasing, as is the demand for electronic components. These components need to be tested for faults, and high frequency signal techniques such as domain reflectometry provides an excellent technique for much of such testing. Because of the high volume of needed testing, automated robotic systems are preferred in order to attain a high throughput for any testing system.

Unfortunately, existing domain reflectometry robotic testing systems suffer from noise introduced by certain sources of imprecision in the systems themselves. For example, U.S. Pat. No. 5,994,909, to Lucas et al., discloses a robotic testing system having two probes 122, 123 mounted on a single robotic arm wherein probe 123 is adjustable so that the distance between the two probes is adjustable. Such a mechanical system is prone to imprecision over time, because of vibration, temperature fluctuations, and like sources of distortion. Similarly, European Patent Application EP 0 953 844 A2 (corresponding to U.S. Pat. No. 6,051,978, to Swart) discloses a two-probe system but having a single probe on each of two robotic arms. Again, maintaining a precise desired distance between the two probes is difficult, again resulting is unwanted distortion of the testing results. Because of such imprecisions in existing systems, the shortest traces that can be tested accurately are those that are 1.5 inches or longer.

The present invention greatly reduces noise by using a single robotic arm that employs twin probes (signal and ground) having a non-adjustable fixed distance (pitch) between them. Because testing often requires a number of different pitches, the robotic arm of the invention is able to select any of a plurality of fixed-pitch probes stored in a probe tip changer assembly. Because this prevents inaccuracies induced by changes in pitch over time plaguing prior art mechanical systems, the present invention is able to successfully test traces as short as 0.5 inches (and at least as long as 150 feet). The shapes of the probe tips and the preferred rectangular shape of the probe tip assembly contribute to accuracy by precisely mimicking the electrical characteristics of coaxial structures. A quick electrical disconnect device permits rapid engagement and disengagement of the probe assemblies from the robotic arm, contributing to rapid throughput. The present invention has a number of other advantages over the prior art as discussed below.

The following references also disclose robotic testing systems having varying advantages and disadvantages: U.S. Pat. No. 6,008,636, to Miller et al.; U.S. Pat. No. 5,781,021, to IIani; U.S. Pat. No. 5,498,965, to Mellitz; U.S. Pat. No. 6,024,526, to Slocum et al.; U.S. Pat. No. 5,844,412, to Norton; U.S. Pat. No. 5,696,450, to Itoh; U.S. Pat. No. 5,498,964, to Kerschner et al.; U.S. Pat. No. 5,469,064, to Kerschner et al.; U.S. Pat. No. 5,105,147, to Karasikov et al.; U.S. Pat. No. 4,881,863, to Braginsky; U.S. Pat. No. 5,631,856, to Keller et al.; U.S. Pat. No. 5,394,348, to Abe; U.S. Pat. No. 5,043,910, to Chiba; U.S. Pat. No. 4,628,464, to McConnell; and U.S. Pat. No. 4,593,820, to Antonie et al.

SUMMARY OF THE INVENTION (DISCLOSURE OF THE INVENTION)

The present invention is of a automated domain reflectometry test system (and corresponding method) comprising: domain reflectometry instrumentation; a robotic arm; and a passive, high frequency probe assembly comprising a signal probe and a ground probe having a fixed, non-adjustable pitch, the probe assembly being electrically connected to the domain reflectometry instrumentation, and being moved, electrically connected to, and retracted from test points on an electrical component to be tested by the robotic arm. In an embodiment, the system additionally comprises a second robotic arm and a second passive, high frequency probe assembly having a fixed, non-adjustable pitch and being electrically connected to the domain reflectometry instrumentation, and being moved, electrically connected to, and retracted from test points on the electrical component to be tested by the second robotic arm, whereby differential domain reflectometry tests may be performed on the electrical component. In another embodiment, differential domain reflectometry tests can be performed with the probe assembly comprising a second signal probe and a second ground probe having a fixed, non-adjustable pitch. In the preferred embodiment, the system employs a probe assembly changing station accessible by the robotic arm, the probe assembly changing station comprising holders for a plurality of probe assemblies, together with a robotic control system that directs the robotic arm to acquire from the probe assembly changing station a probe assembly having a correct pitch for testing of test points of the electrical component having a same pitch. A calibration/verification station accessible by the robotic arm is preferably employed that comprises a calibrated airline. The system can test traces having a length of between approximately 0.5 inches and 150 feet such that a standard deviation of domain reflectometry test result impedances is 0.03 ohms or less. The probe assembly mimics electrical characteristics of a coaxial structure. The system can test components comprising dimensions of between approximately 5.25 inches×0.5 inches and 36 inches×28.5 inches. The robotic control system comprises software for automatically planning testing of the electrical component by importation of computer aided design data for the electrical component. The system records impedance and propagation delay and calculates a dielectric constant for each test point of the electrical component.

The invention is also of a probe assembly changing station for a robotic domain reflectometry test system (and method), which changing station is accessible by a robotic arm of the system, the probe assembly changing station comprising holders for a plurality of passive, high frequency probe assemblies affixable to an end of the robotic arm and from which the robotic arm can without human intervention affix any of the plurality of probe assemblies. In the preferred embodiment, each of the probe assemblies comprises a passive, high frequency probe assembly comprising a signal probe and a ground probe having a fixed, non-adjustable pitch.

The invention is additionally of a robotic domain reflectometry test system (and corresponding method) comprising: differential domain reflectometry instrumentation; at least one robotic arm; and two passive, high frequency probe assemblies each comprising a signal probe, each the probe assembly being electrically connected to the differential domain reflectometry instrumentation, and being moved, electrically connected to, and retracted from test points on an electrical component to be tested by the at least one robotic arm. In one embodiment, the at least one robotic arm comprises a single robotic arm holding both the probe assemblies. In another embodiment, the at least one robotic arm comprises two robotic arms each holding one of the probe assemblies. In one embodiment, at least one of the probe assemblies additionally comprises a ground probe having a fixed, non-adjustable pitch with respect to the signal probe on the at least one of the probe assemblies. In another embodiment, both of the probe assemblies additionally comprise a ground probe having a fixed, non-adjustable pitch.

The invention is further of a robotic domain reflectometry test system (and corresponding method) comprising: domain reflectometry instrumentation; a robotic arm; a passive, high frequency probe assembly comprising a signal probe and a ground probe, the probe assembly being electrically connected to the domain reflectometry instrumentation, and being moved, electrically connected to, and retracted from test points on an electrical component to be tested by the robotic arm; and components recording impedance and propagation delay for each test of the test points and calculating and recording a dielectric constant for each test of the test points.

The invention is also of a robotic domain reflectometry test system (and corresponding method) comprising: domain reflectometry instrumentation; a robotic arm; and a passive, high frequency probe assembly comprising a signal probe and a ground probe, the probe assembly being electrically connected to the domain reflectometry instrumentation, and being moved, electrically connected to, and retracted from test points on an electrical component to be tested by the robotic arm; and wherein the system can test traces having a length of between approximately 0.5 inches and 150 feet such that a standard deviation of domain reflectometry test result impedances is 0.03 ohms or less.

The invention is additionally of a robotic domain reflectometry test system (and corresponding method) comprising: domain reflectometry instrumentation; a robotic arm; a passive, high frequency probe assembly comprising a signal probe and a ground probe, the probe assembly being electrically connected to the domain reflectometry instrumentation, and being moved, electrically connected to, and retracted from test points on an electrical component to be tested by the robotic arm; and a calibration/verification station accessible by the robotic arm and comprising a calibrated airline. In the preferred embodiment, the calibrated airline is a 28 ohm or 50 ohm NIST calibrated airline.

A primary object of the present invention is to provide a robotic domain reflectometry system with high accuracy.

Another object of the present invention is to provide a system that can move from test point to test point rapidly.

A primary advantage of the present invention is that it can provide accurate and repeatable domain reflectometry tests of traces of length between 0.5 inches and 150 feet (or more).

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings:

FIGS. 5(a)–(d) are perspective, top, and two cross-section views of the preferred ground nib assembly of the present invention used in conjunction with the signal probe assembly of FIGS. 4(a)–(d);

DESCRIPTION OF THE PREFERRED EMBODIMENTS (BEST MODES FOR CARRYING OUT THE INVENTION)

The present invention is of an automated domain reflectometry system and method for testing electrical components, such as traces in a printed circuit board ("PCB"). For purposes of the specification and claims, "domain reflectometry" ("DR") includes tests at a single frequency, known in the art as time domain reflectometry ("TDR") and at multiple frequencies, the devices for which are known in the art as network analyzers.

Figure 1:
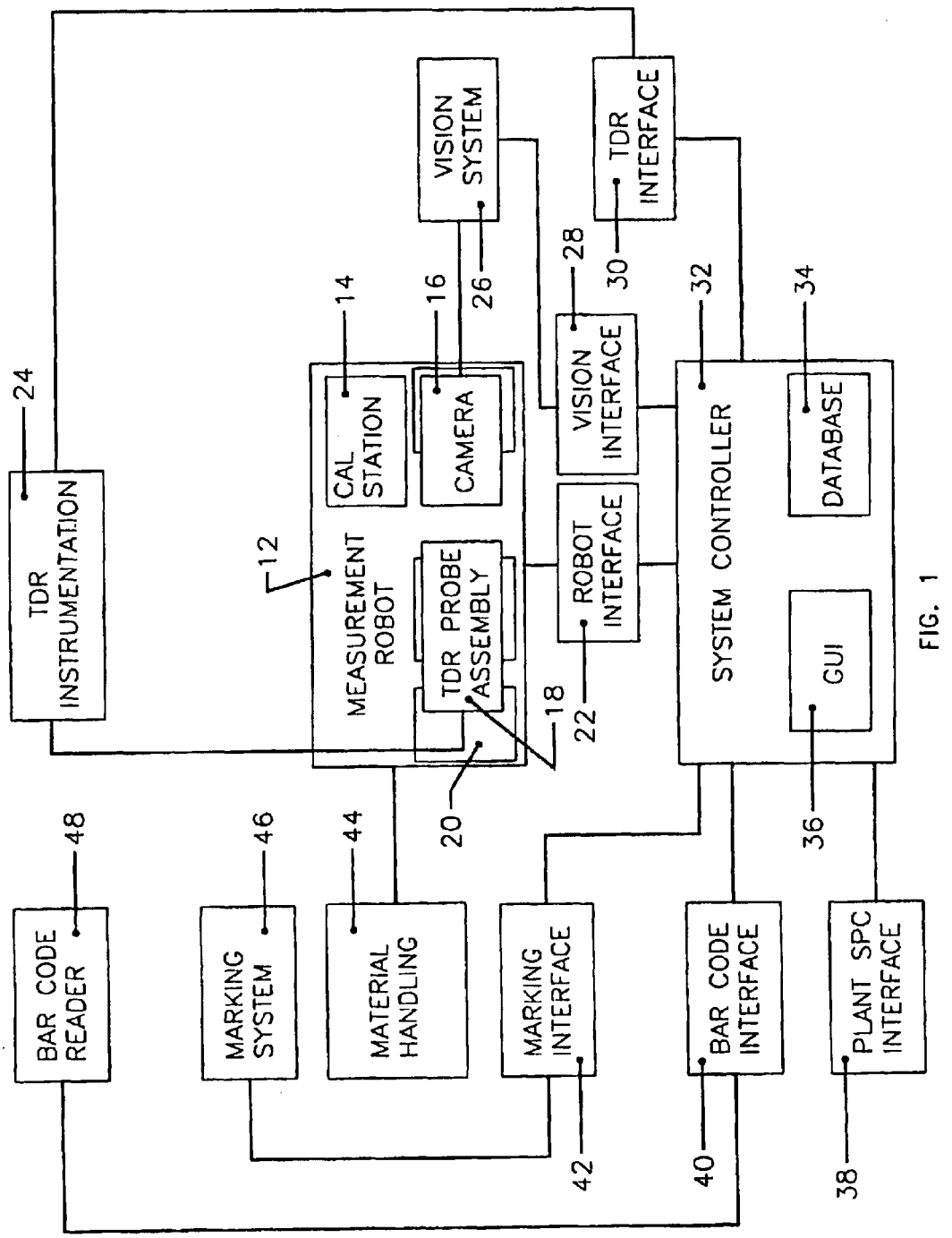
FIG. 1 is a block diagram of the preferred robotic domain reflectometry testing apparatus of the invention.
Figure 2:
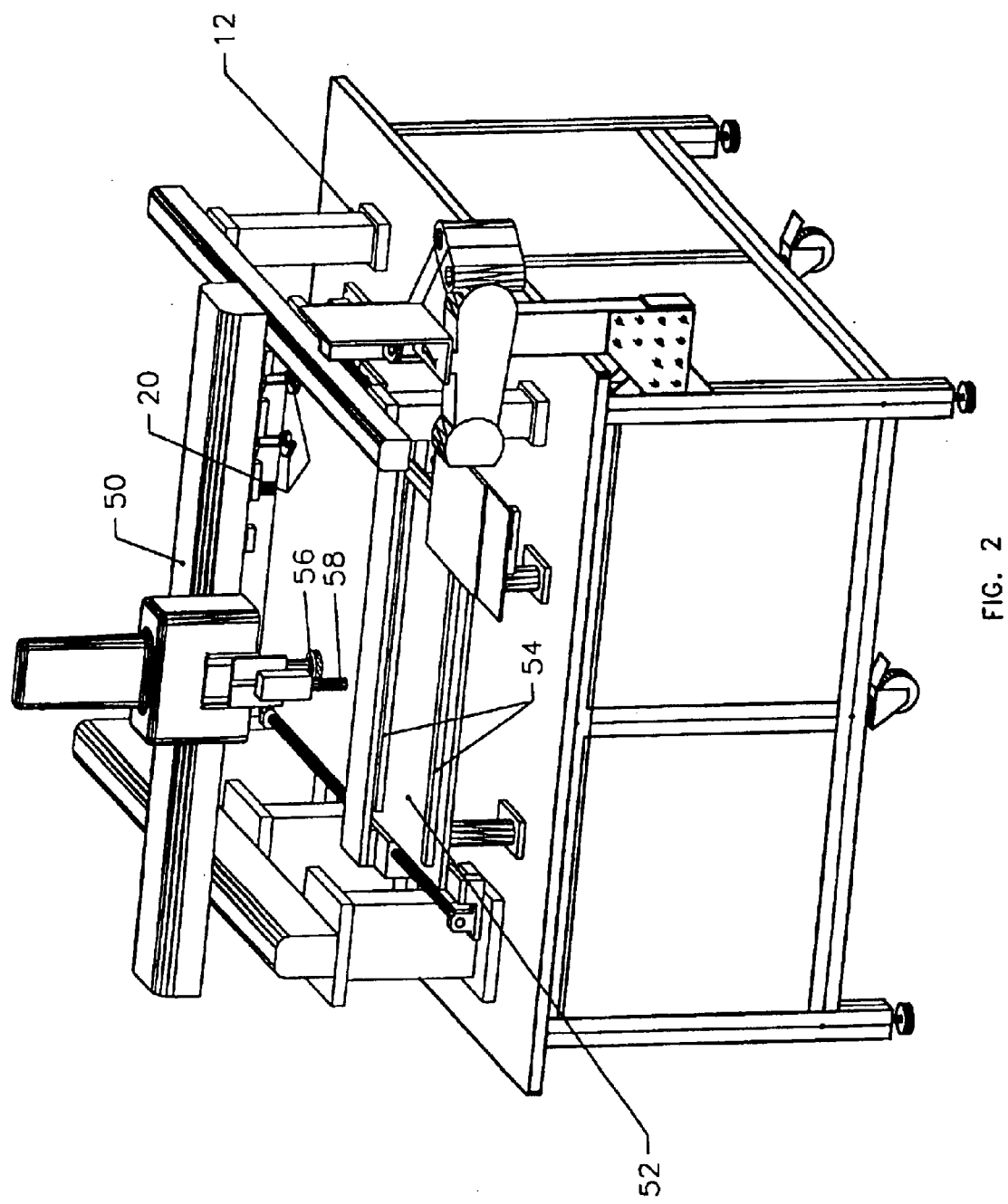
FIG. 2 is a perspective view of the measurement robot assembly of the apparatus of FIG. 1.

FIG. 1 illustrates the preferred embodiment of the robotic domain reflectometry testing system 10 of the invention, but FIG. 1 is not intended to apply any particular spatial relationship between the components. The system includes measurement robot assembly 12, calibration/verification station 14, camera 16, DR probe assembly 18, DR probe changing assembly 20, robot/controller interface 22, DR instrumentation 24, vision system 26, vision interface 28, DR instrumentation/controller interface 30, system controller 32 comprising database 34 and graphical user interface ("GUI") 36, controller/manufacturing plant interface 38, barcode/controller interface 40, marking system/controller interface 42, material handling system 44 (may be manual or automated, such as a conveyor system), marking system 46, and barcode reader 48. FIG. 2 shows the measurement robot area 12 of the invention (without calibration/verification station), including probe tip changer assembly 20, robotic arm assembly 50, testing platform 52, board/panel clamping system 54, probe tip assembly holder 56, and camera 58.

The present invention is designed to lower the cost and maximize the throughput of the domain reflectometry measurement process. Electronics products are being designed with higher signal speeds and the manufactured product must be built to higher tolerances and better quality. Examples of this are RAMBUS products that have required PCB designers to utilize PCB traces with lower impedance (28 ohms as compared to the traditional 50–100 ohm circuit board traces). The standard ten percent (10%) manufacturing tolerances on the trace impedance becomes more difficult to meet at this lower impedance (Tolerance=+/−2.8 ohms). In order to meet this tight tolerance, 100% controlled impedance testing is done on all new PCBs with RAMBUS technology to ensure the quality of the manufactured product. The large number of PC motherboards and memory modules which are produced to satisfy world demand dictates the need for automated DR measurement equipment to keep down the cost of these tests. Throughput requirements and accuracy/repeatability of the process are also benefits of an automated process. Tests of the system of the invention according to a Gauge Repeatability and Reproducibility ("Gauge R&R") study specified by RAMBUS and Intel Corporation show the system to have a standard deviation of at most 0.03 ohms, showing high accuracy/repeatability characteristics of the system of the invention.

Manual DR probing induces error in the measurement process. The current error window of prior art TDR instruments and the manual probing process limits the measurements to be taken to longer traces (longer than actual/real length RAMBUS traces found on a memory module or motherboard). These longer traces are found on "test coupons" which are manufactured along side the actual board. These coupons contain longer traces (e.g., six inches, 22 inches) and contain larger test points (greater pitch between ground and pin) to facilitate the manual measurement process. These coupons in critical high tolerance manufacturing process may not reflect the quality of traces on the actual product due to difference in the process equipment. Additionally these coupons add cost (material and processing costs) and reduce throughput capacity. The accuracy of the robot positioning will allow DR probes to contact smaller geometry's associated with the actual boards and the reduction of some of the measurement error (that due to hand probing) will allow DR measurements to be taken on small trace lengths (those associated with the actual product). This allows elimination of test coupons and saves cost, and improves testing accuracy as boards actually to be delivered to end customers may be tested, not just coupons.

The present invention can perform DR testing on traces as short as approximately 0.5 inches and as long as approximately 150 feet or even higher. For TDR, the invention provides a TDR risetime of approximately 32 psec and a falltime of approximately 53 psec. Test speed is between approximately 1 to 4 seconds per test point.

Products to be tested will typically exist in one of the two following configurations: (1) a panel consisting of several small boards attached together, such as 6–8 memory modules boards or 1–2 motherboards on one panel; and (2) a single bare board (i.e., PC motherboard, memory module, memory tower board, etc.). The present invention can handle very small products to very large products, such as from approximately 5.25 by 0.5 inches to approximately 36 by 28.5 inches.

Sampling heads within DR instrumentation are extremely sensitive to high voltage typical in static charge. These high voltage charges may either permanently disable the measurement system or reduce the capability to accurately measure. The PWB boards or test coupons will gather static charge during the manufacturing process, routine handling, and during storage. This static charge must be eliminated prior to the connection of the probe assembly to the boards test points. A grounding mechanism to discharge boards and ionization guns or fixed wands dispensing polarized air can be used.

The preferred embodiment of the invention employs single ended DR probing using a probe with a fixed, non-adjustable pitch (distance from signal pin to ground pin). This technique involves the use of a single probe mechanism which contains a single signal and ground pair of connections between the DR instrument and the board under test. In this testing approach the DR instrument injects the test pulse into a circuit trace at the test point interface and then measures the reflected waveform at the same test point as well as, preferably, the time delay between the signal and reception of the reflected waveform. Therefore, in this testing scenario there is a single DR probe (which contains a signal pin and a ground pin a fixed distance apart) mounted on a single moving robotic arm.

Figure 3:
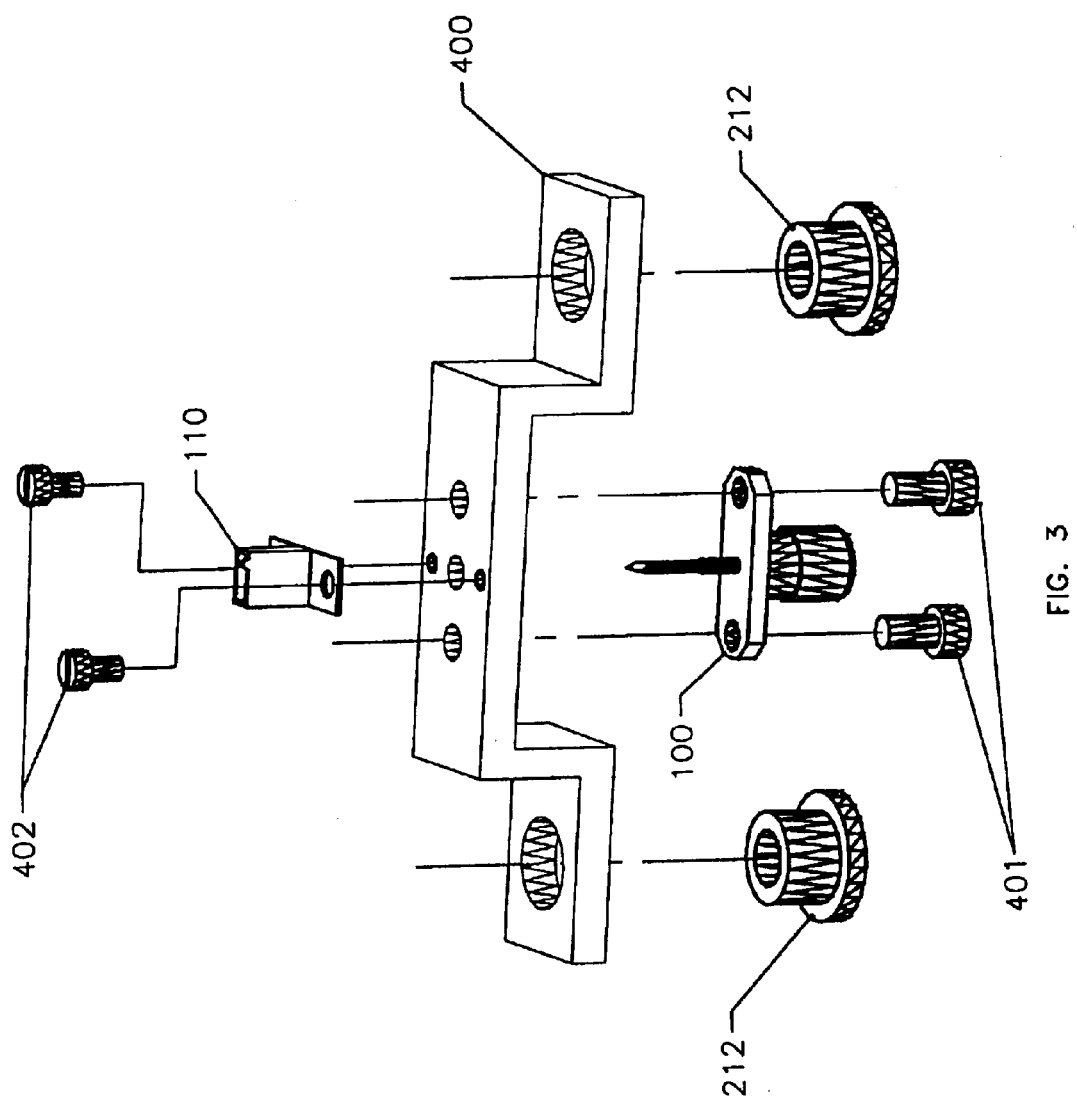
FIG. 3 is an exploded view of the preferred probe tip assembly of the invention.

The components of the preferred probe tip assemblies of the invention are shown in FIGS. 3, 4(a)–(e), and 5(a)–(d) which show the preferred but illustrative dimensions. FIG. 3 shows the components of the probe tip assembly which is comprised of the following: signal probe tip assembly 100 with two brass mounting screws 401; ground probe tip assembly 110 (preferably made of brass) with two brass mounting screws 402; probe assembly body bracket 400 (preferably made of brass); and two non-conductive bushings 212.

Figure 4B:
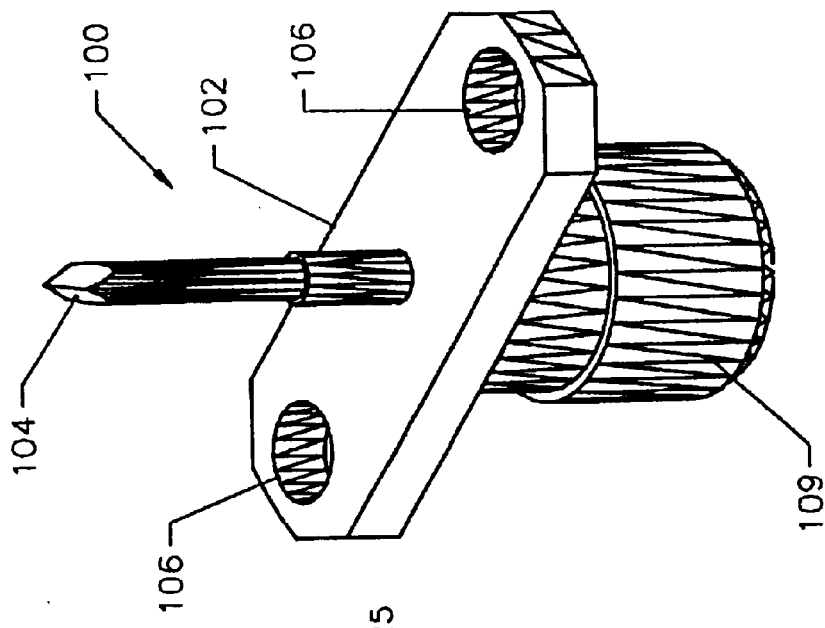
FIGS. 4(a)–(e) are side and perspective views of the preferred signal probe assembly of the present invention, and side, front, and top views of the preferred signal probe tip of the present invention.
Figure 4A:
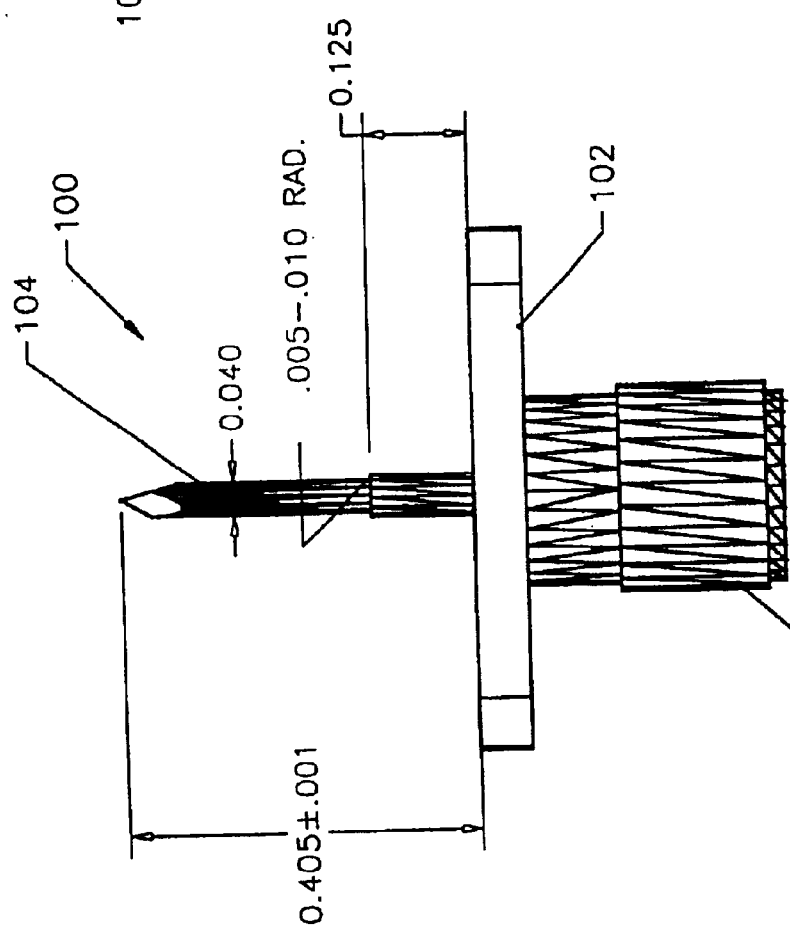
Figure 4E:
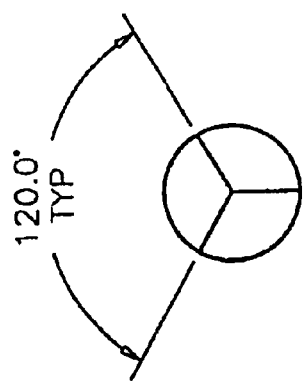
Figure 4D:
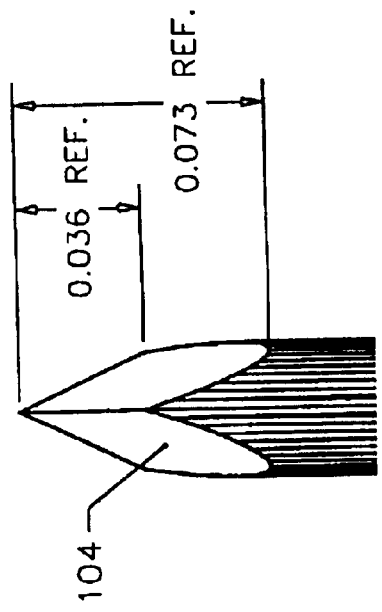
Figure 4C:
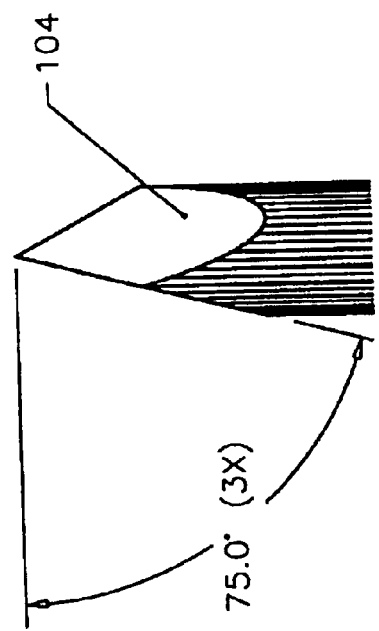
Figure 5A:
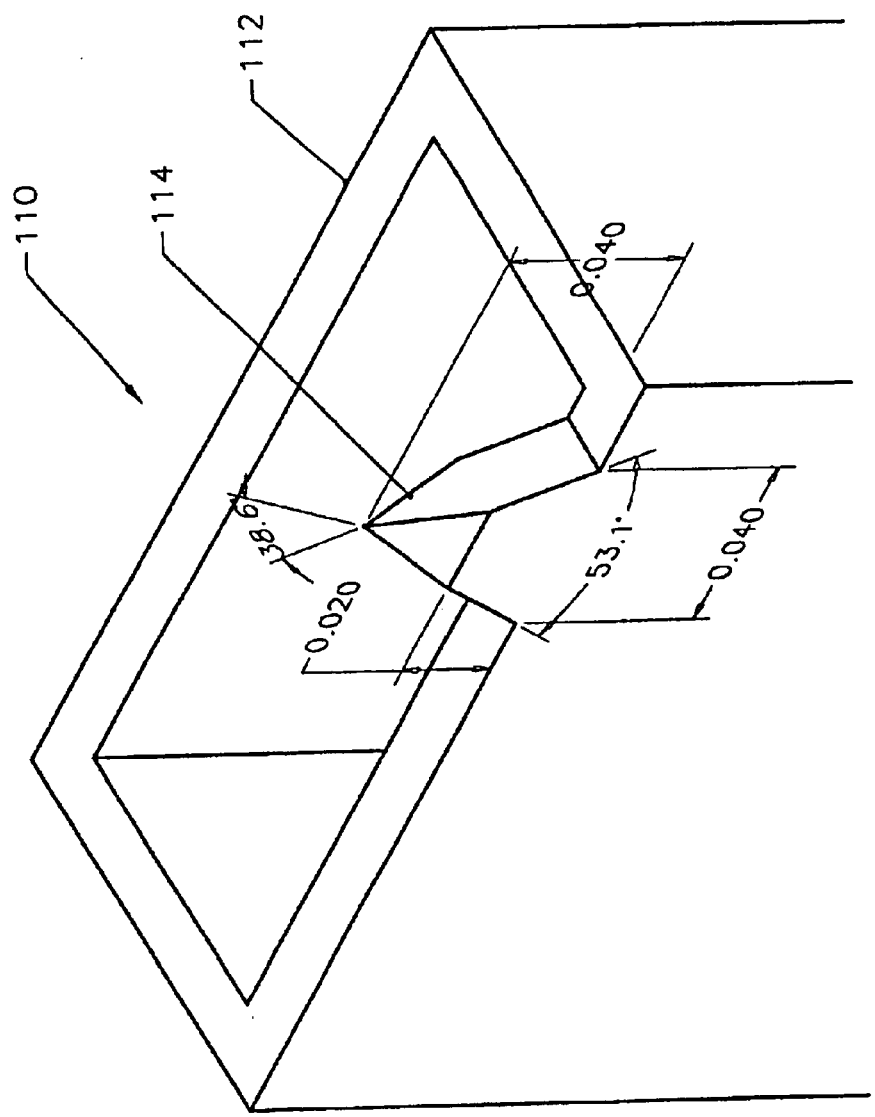

FIGS. 4(a) and (b) show the preferred signal probe tip assembly 100, comprising a coaxial cable interface 109 which mates with a corresponding connector electrically connected back through the robotic arm to the testing instrumentation by coaxial cable and male/female connectors. The coaxial connector's ground is electrically connected to the ground flange 102, and with the probe assembly body backet 400 through physical connection and through the two brass mounting screws 401 and thus with ground sleeve 110 through its mounting onto the probe assembly body bracket 400 with the two brass mounting screws 402. The coaxial connector's signal is electrically connected with signal probe tip 104, which is insulated from the ground flange 102. The probe assembly body bracket 400, has support holes which can be engaged by non-conductive bushings 212 to physically support the probe tip assembly. The preferred shape of signal probe tip 104 is shown in FIGS. 4(*c*)–(*e*).

Turning now to FIGS. 5(*a*)–(*d*), these show conductive ground nib assembly 110, which in use is physically connected with the probe assembly body bracket 400 such that base plate 116 is physically and electrically connected to probe assembly body bracket 400, creating a conductive ground path through sleeve 112 to ground nib/tip 114. The dimensions of the assemblies 100 and 110 are arranged so that both nib 114 and signal probe tip 104 preferably protrude from sleeve 112 by the same distance. Alternatively, signal probe tip 104 can be longer in order to permit it to be compliant when contacting a board under test.

Assemblies 100 and 110 are configured so that by placing the nib 114 at any point on sleeve 112 retains electrical properties of the combined assembly such that a coaxial structure is mimicked despite changes in distance (pitch) between nib 114 and signal probe tip 104. Preferably, the conductive portions of the assemblies are copper.

Figure 6:
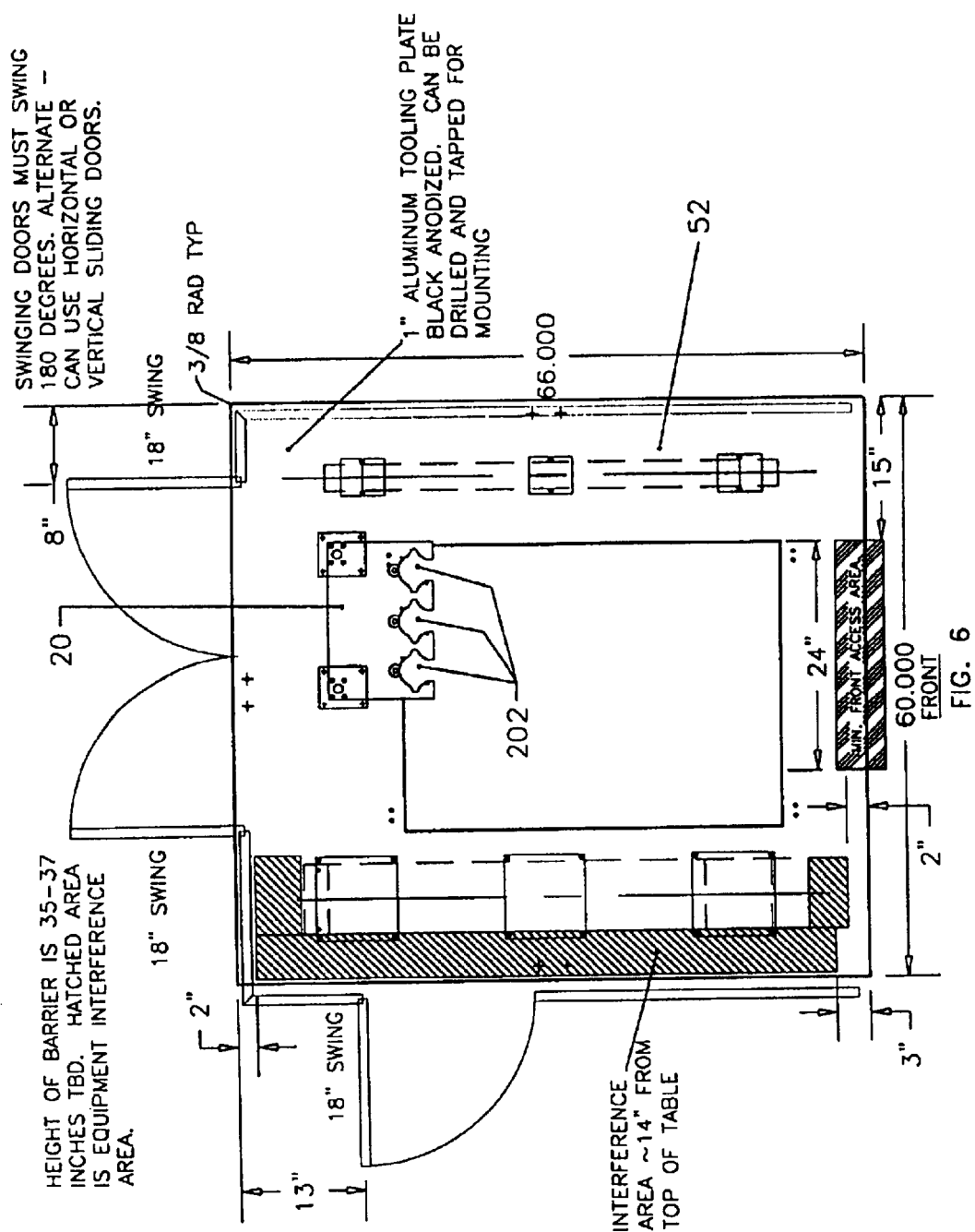
FIG. 6 is a top view of the measurement robot assembly showing placement of the probe tip changer assembly of the invention.

Turning to FIGS. 6–10, the preferred embodiment of the invention comprises probe tip changer assembly 20. In FIGS. 6–10, an assembly comprising three stations 202 is shown, but a single assembly having any number of stations, or two or more assemblies (each with any number of stations) may be incorporated into the system with ease. Preferably the probe tip changer assembly or assemblies are located at an edge of testing platform 52, as shown in FIG. 6.

Figure 7:
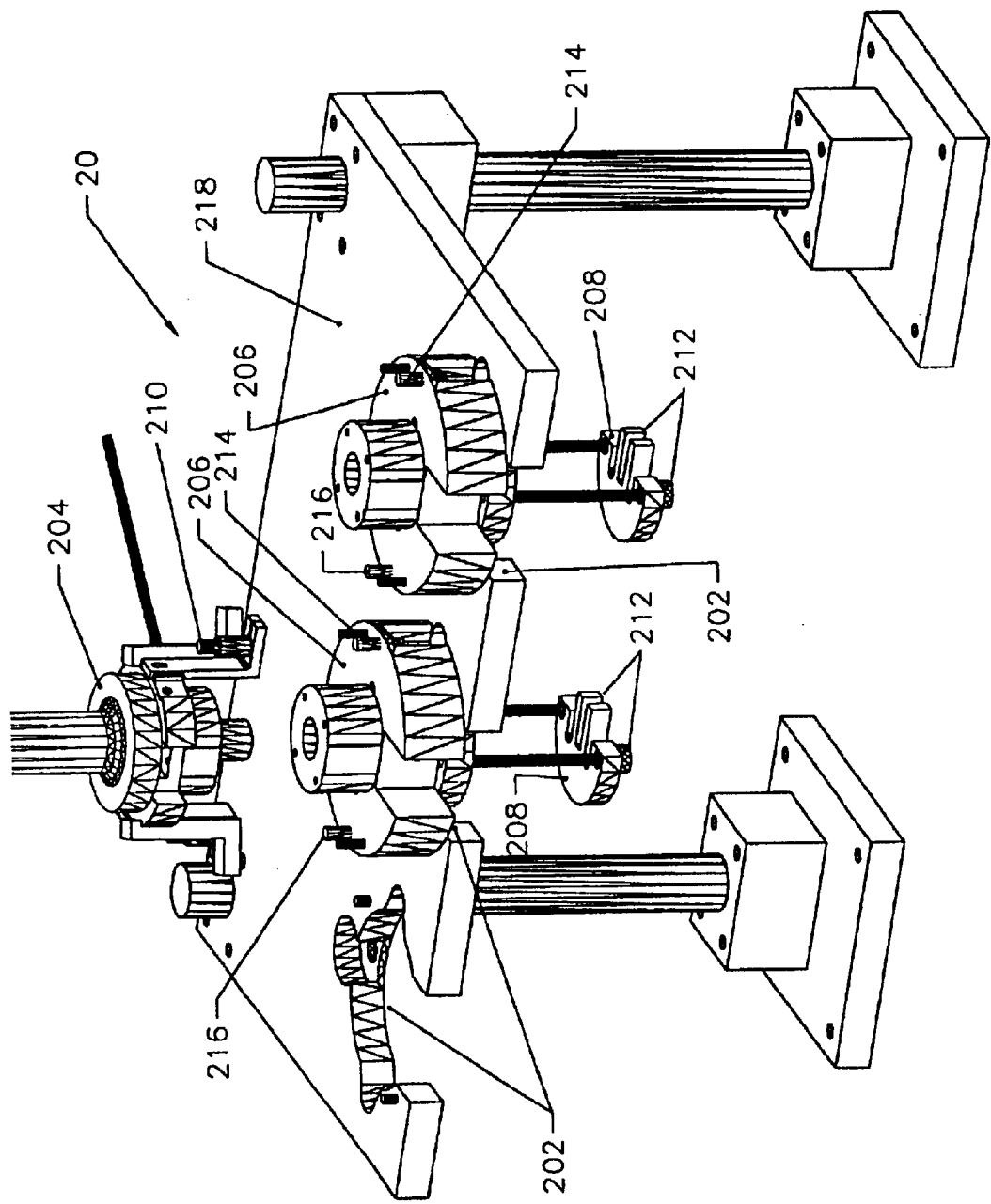
FIG. 7 is a perspective view of the robot arm about to engage a probe tip assembly (probe tip and ground nib not shown) stored in the probe tip changer assembly.
Figure 8:
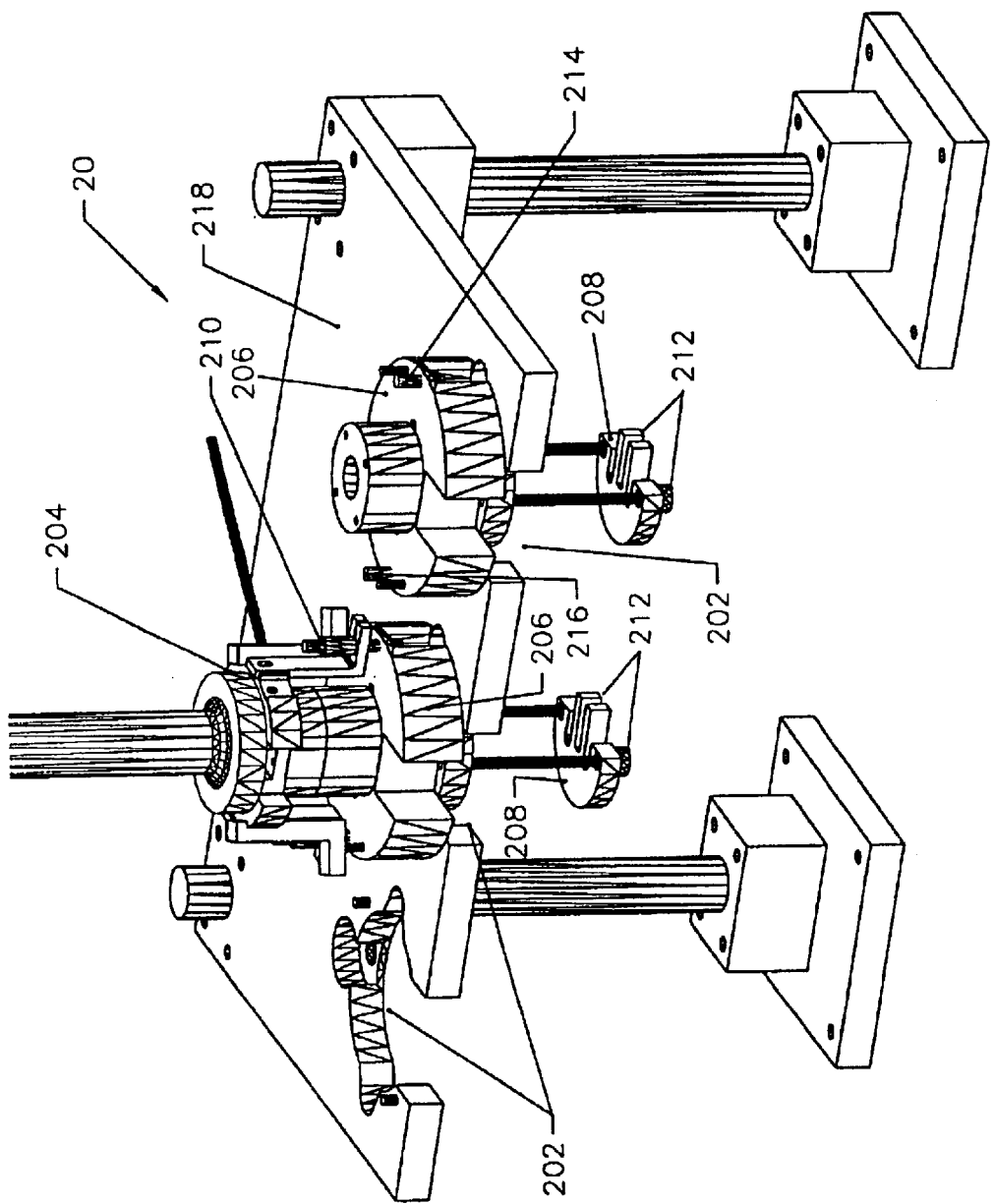
FIG. 8 is a perspective view of the robot arm having engaged a probe tip assembly stored in the probe tip changer assembly.
Figure 9:
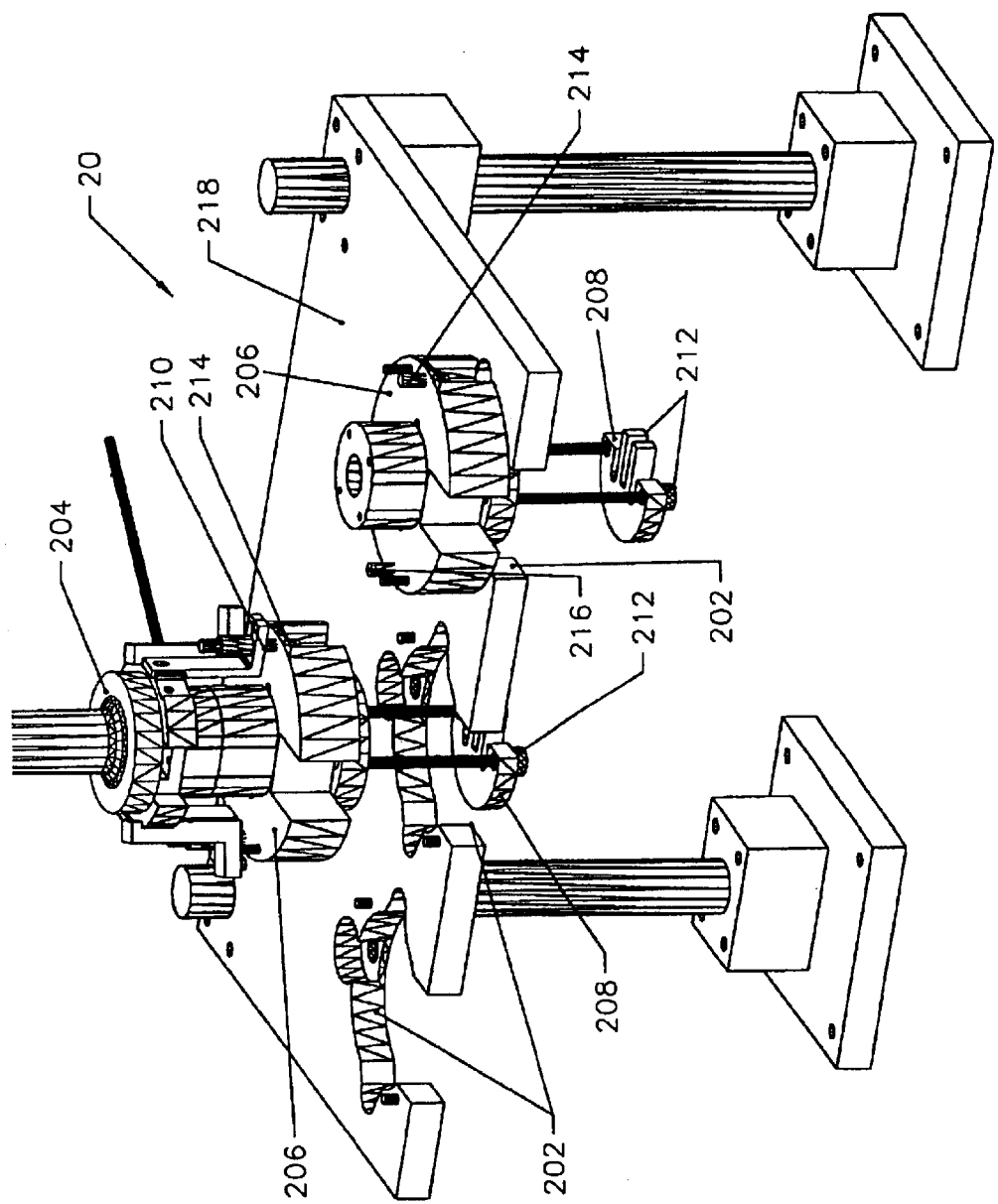
FIG. 9 is a perspective view of the robot arm having extracted a probe tip assembly from the probe tip changer assembly.
Figure 10:
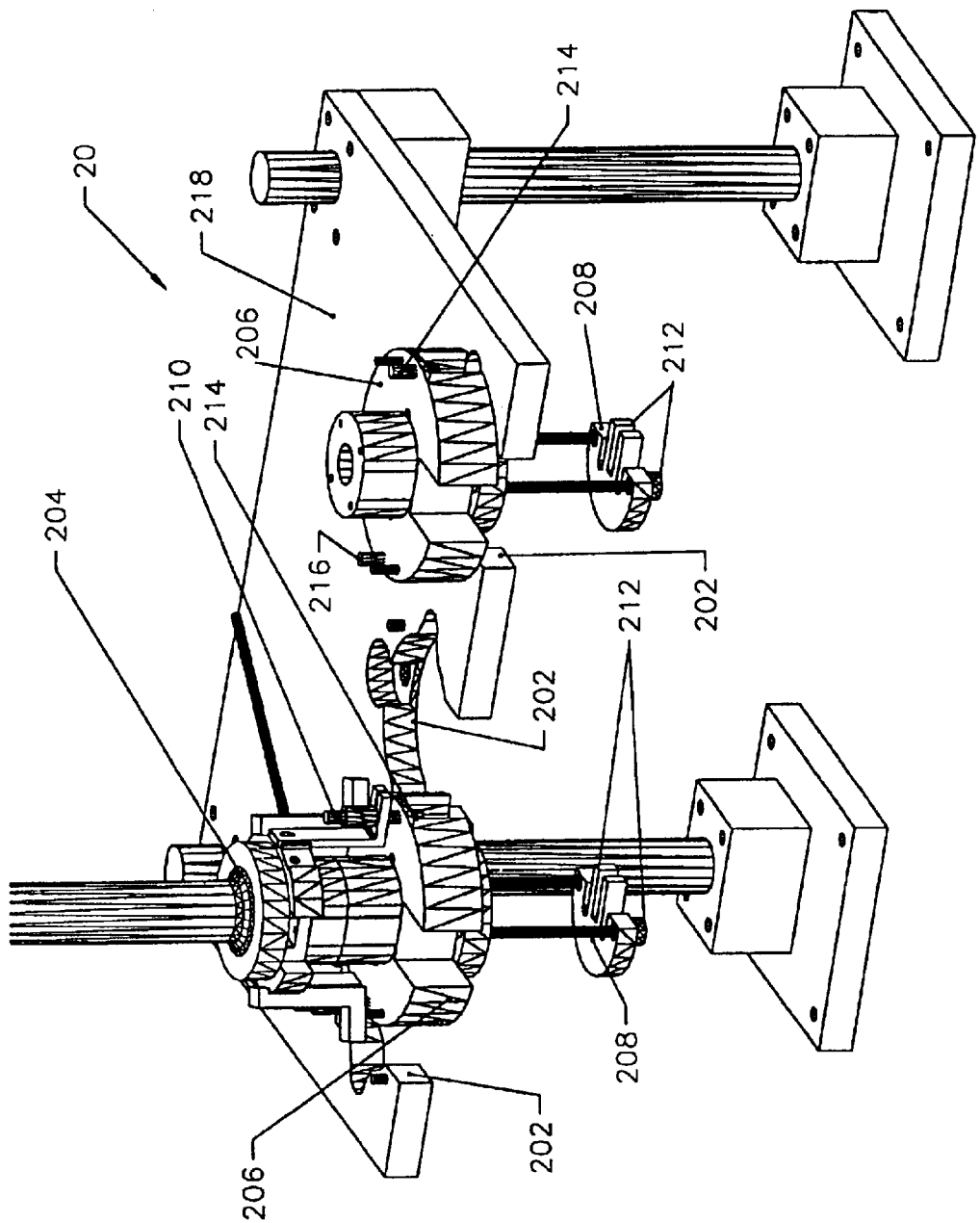
FIG. 10 is a perspective view of the robot arm after having removed a probe tip assembly from the probe tip changer assembly area.

The probe changer system 20 provides the ability for various fixed-pitch probes (single-ended, differential, etc., of varying pitch or combinations of pitch) to be automatically changed onto the robot system's test head. The probe changer system preferably comprises the following items:

Probe Stand. Referring to FIG. 7, Probe stand 218 preferably comprises three slots or stations 202 to hold up to three probe holder assemblies 206 at a time for automatic pick-up by the robotic system. Each slot is monitored for the presence of a probe holder assembly. In the preferred embodiment, up to two (2) tool stands (for a total of six probe assemblies) are mounted in the robot area. (An alternative approach is to have a carousel holding many probe assemblies. This carousel would be rotated into a position where the robot system test head would be pick-up the needed probe assembly. The carousel would be computer controlled and use motor/encoder system.)

Probe Changer—Robot Side. The robot probe changer 204 is fixed to the end of the robot arm and allows the robot to automatically pick up a variety of probe assemblies. It contains all of the necessary electrical hook-ups including high frequency coaxial quick disconnect 210 and a tool identification system which can identify which probe the robot currently is utilizing (not shown). For differential DR, a second high frequency coaxial quick disconnect can be employed, preferably opposite the first on the other side of robot probe changer 204. The preferred quick disconnect device is the QT3.5mm™ connector (8006Q1 Guide Sleeve) device by Maury Microwave Corporation.

Probe Changer—Probe Side. The probe holder assemblies 206 are designed to hold distinct combinations of signal probe tip assemblies 100 and ground nib assemblies 110. For example, assembly combinations having six different pitches can be connected to six probe holder assemblies 206 via non-conductive bushings 212 in a system having two three-station probe stands 218. Each probe holder assembly preferably comprises coaxial connector 214 which mates with high frequency coaxial quick disconnect 210. For differential DR, a second coaxial connector 216 connects with the second high frequency coaxial quick disconnect (not shown). Clamp 208 is provided to secure a combination signal probe tip assembly 100 and ground nib assembly 110, together with non-conductive bushings 212. A coaxial cable (not shown) (or two for differential DR) in the bottom of each probe holder assembly 206 connects to the coaxial connector to the signal probe tip assembly 100.

The present invention can also perform differential DR probing which involves the use of two separate DR probes (each preferably with a fixed pitch ground pin and a signal pin). One probe is placed on a test trace and a test pulse is injected. The second probe is placed on a trace which is routed in the physical vicinity of the first (typical with PCB functions that involve differential signal communications). The second probe also injects a test pulse. Both output edges must be phase aligned. The resultant impedance (combined value of both traces) is then measured and recorded, as well as preferably the time delays involved. Alternatively, one passive high frequency probe assembly can have a signal probe and the other both signal and ground, or both assemblies can have only a signal probe and no ground probe. The reduction of the number of ground probes in these two alternative embodiments produce lower accuracy results than the preferred embodiment.

Differential DR probing on test coupons can be accomplished with one (1) independently moving arm on the robot. The test coupons are typically designed so the two separate test points for the differential traces are side by side and are spaced at equal distances. This allows the use of a single arm moving a special probe assembly that contains two (2) probe mechanisms.

Figure 12:
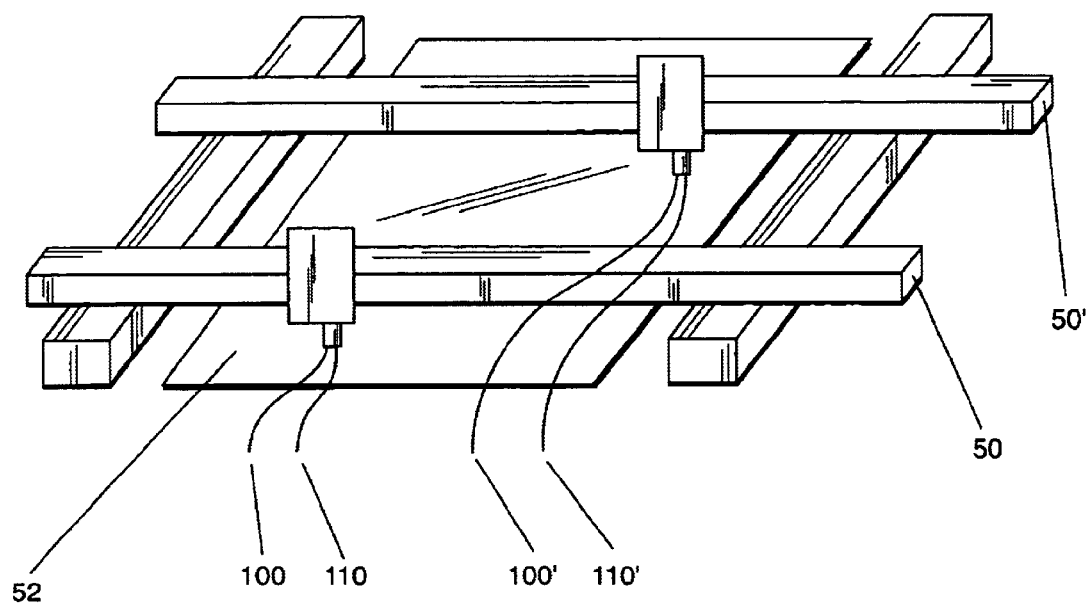
FIG. 12 is a perspective view of the measurement robot assembly of an embodiment for differential TDR employing two robotic arm assemblies each with signal/ground probes.

Differential DR probing on printed wiring board ("PWB") cards, as opposed to test coupons, sometimes dictates the need for two (2) independently moving arms 50, 50' as part of the robot, as shown in FIG. 12. Each arm holds a single probe mechanism with signal probe 100 or 100' respectively and ground probe 110 or 110' respectively. In this manner the system can independently place each of the two probes as required to carry out the differential TDR testing.

The DR instrumentation should be mounted as close as possible to the Z-axis probe assembly. A flexible platform to allow for the DR instrumentation and accessories is preferably provided. Although most of the DR instrumentation control and monitoring will be done remote from the Operators Console, front panel DR instrument displays and controls should be accessible/viewable by the operator during normal equipment operations. This requires the instrument to be at uncovered, at eye level or below and mounted near the perimeter of the equipment to facilitate easy operator control/viewing.

For TDR, the preferred instrumentation is a Tektronix TDS8000 or 11800 series with SD24 TDR module or a Hewlett-Packard HP54750A with HP54754 TDR module, which have distinct mechanical connection and hardware interface requirements, as understood by one of ordinary skill in the art. The Operator's Station then provides direct access to the instrument supplier's emulation package within the equipment's operating software. This control allows troubleshooting and manual setup of the instrument if desired by the operator or set-up personnel.

The equipment operator preferably manually loads panels into the equipment. This loading process should be simple (non-precision placement of panel) and should be quick to accomplish. This is preferably done by a foot-operated clamping system that leaves both hands free and that keeps the panel raised so that the bottom side is exposed only to air and is not contacting a surface below. The preferred holder has pneumatic foot pedals that control the opening and closing of the holder's moving clamp. The operator simply places a board onto the bed of the holder and then closes the holder's moving clamp. The holder will simultaneously lift the board off the holder bed (leaving an air gap below the board) and clamp the board firmly and repeatably in place for testing. Alternatively, an automated system (such as a conveyor system) may be employed to load and unload panels. This alternative is attractive where large quantities of a single type of panel are being tested. A buffer time is set sufficient to allow time for the operator to load and unload panels without causing the equipment to stop processing boards. Processing time for a panel (board) with only one measurement point can be as small as six seconds. Typical total process time is approximately 15–20 secs.

The present invention is able to quickly set up testing for all types of panels. All the necessary information about the specific board (panel) characteristics is preferably imported from a panel's CAD/CAM files using the IPC file format. A detailed description of this data format can be found in the IPC document IPC-D-356, "Bare Substrate Electrical Test Data Format". Alternately, a vision system can be utilized to learn all the necessary characteristics of the board in order to probe it.

CAD information which the robot of the invention needs may come from several sources (different CAD packages, Gerber packages, etc.). The system software imports multiple files to retrieve the data that it needs to define the robot probing (as long as each file complies with the IPC file format). A typical example of this would be that one file will contain the basic netlist information from the design CAD package outputs (i.e., Net name, reference designator, etc.) and a second file will contain the conductor segment data from the manufacturing CAM package outputs (i.e., trace size, layer, aperture, drill file, etc.)

The IPC format breaks the board data into sets with an "Op Code" label. The system software uses these labels to know what data type is being presented next in the file.

Op Code#099 is a list of the minimum data set which should be supplied to enable the robotic system of the invention to function. This minimum data should include all nets which could be probed including all grounds which will be used for the DR measurements. Items supplied are Signal Name, Side Access, Probe Point X, Y Data, and Z Data information.

Op Code#317 or 327 may be employed if test points are not defined and are not available within the IPC file format. The robotic system software can import the listed net list data which will define all available geometry on the board. Items supplied are Net Name, Component Reference Designator (Via, U34.8, TP123), Middle of Network Flag, Hole Diameter, Plated or Unplated Throughhole, Primary or Secondary Side Access, X, Y Location of Centriod of Feature, Size of Feature (X, Y, and Rotation), and Presence of Solder mask.

Op Code#389 provides the Board Dimensional Outline or the Panel Dimensional Outline, if a panel is to be tested.

Op Code#390 allows for the inclusion of the controlled impedance design specifications to be output from design to the manufacturing test system. Items supplied are Layer Number, X, Y Location of Feature, X, Y Dimension of Feature Size, Signal Name, Expected Impedance Value in Ohms, Expected High Test Value, Expected Low Test Value, and Single Ended or Differential Measurement.

Op Code#090 allows for the inclusion of differential controlled impedance design specifications to be output from design to the manufacturing test system. This data refers to the reference trace used during differential DR. Items supplied are Layer Number, X, Y Location of Feature, X, Y Dimension of Feature Size, and Signal Name.

Op Code#378 contains information available from the CAM systems and contains the typical Gerber photoplot data. Items supplied are Net Name, Conductor Layer Number, Aperture Size, and Trace X, Y Coordinates.

Op Code#309 contains panel information which defines the X, Y offsets that are needed to tell the robot where the individual boards are within the panel. Items supplied are Panel Image Mirrored, Panel Image Rotated, and X, Y Offsets from Primary Image.

The imported data sets can be manipulated inside a database (individual records updated or entire fields changed) through the use of graphical user interface (GUI) screens that provide easy access to the data records in the database. Typical changes to the database records are as follows:

1) Complete definition of the test points (i.e., just test 12 points);
2) Reducing the number of test points;
3) Manual data input of controlled impedance information;
4) Manual data input of panel offset information; and
5) Selection of all test points which are tied to traces which are 3" or shorter (or any other desired length).

The system software preferably displays a graphical representation of the board (panel) using the data imported and present in the database. The operator can select the type of data that will be displayed. The graphical display preferably can include the following data: all test points; all test points and their associated traces; all test points and associated traces where differential controlled impedance testing is indicated (how the test points are matched in pairs are shown); panel and individual boards; fidicuals; and all nets. The manual selection of test points can be conducted using the graphical display by clicking on a selected via and the via will be flagged as a Test Point.

A routine preferably automatically scans the imported data and selects the appropriate ground point for the DR probe. This selection will be based on the pitch capability of the set of fixed pitch probes available to the system of the invention and will identify the orientation of the signal-ground pair. A routine automatically scans the test points selected in the database and organizes them in a sequence that optimizes the robot's mechanical movements. The starting point is preferably the robot's identified mechanical zero.

The present invention preferably includes a vision system to maintain proper orientation of the robot. A GUI screen allows the setup technician to teach the robot where the fiducial(s) will be during the process of board-to-robot orientation. Local Fiducials can be identified within a board or within a panel to ensure that a board section within a larger board (or board within a panel) is orientated properly.

The operator through a GUI screen will select an appropriate data file which corresponds to the board which is to be run (alternately this will be done by the system through vision and/or a board code reader). This file preferably contains the following data: XY Coordinate data; DR test parameters; and fiducial locations.

An operations manager preferably has access to display screens which will detail the operations of the equipment. For example, the following reports should be provided: summary of last 500 boards run with serial numbers and data result; summary list of fatal errors, equipment process time, equipment operations log; and summary of the board throughput over the last hour, last 8 hours, last 24 hours, last 7 days and since the last operator change (shift change), and the like. The data which is available on the operator's station display screens is preferably available across an interface to a plant computer. This interface should ideally be Ethernet and utilize the protocols of the plant's computer system.

The following is a basic sequence of steps in the operations of the equipment.

1) Operator places board onto system and clamps in place.
2) Operator enters the part number and serial number (if available) of the board into the systems GUI or alternately this is automatically determined by the system's vision system/bar code reader.
3) The robot moves the camera to the location of the fiducials and precisely locates the board position with the image processing data and adjusts the robotic movement accordingly.
4) The robot then moves to the first test point.
5) The robot engages onto the first Test Point on the board.
6) A DR measurement is taken and stored (with serialized data if acquired previously).
7) The robot moves to the second and subsequent test points and repeats the measurement process.
8) Upon completion of the measurements, the robot retracts and moves to the starting location.
9) The board is unclamped and removed and the process repeated for the next board.

For TDR in particular, the present invention's primary function is to collect impedance values, in ohms, for each test point that it is instructed to move to. Multiple tests can be conducted at each test point, such as three. Preferably, time delay values are collected as well, which information permits a computation of a dielectric constant.

The following data is preferably stored in a local database for each test point: board name, board serial number, test point serial number, low (ohms), mean (ohms), high (ohms), propagation delay (psec), and test pass/fail. This data can be viewed locally at the Operators Station, printed out from the Operators Station, or transfered to a remote computer through either standard file transfer protocols or through a SPC system.

Figure 11:
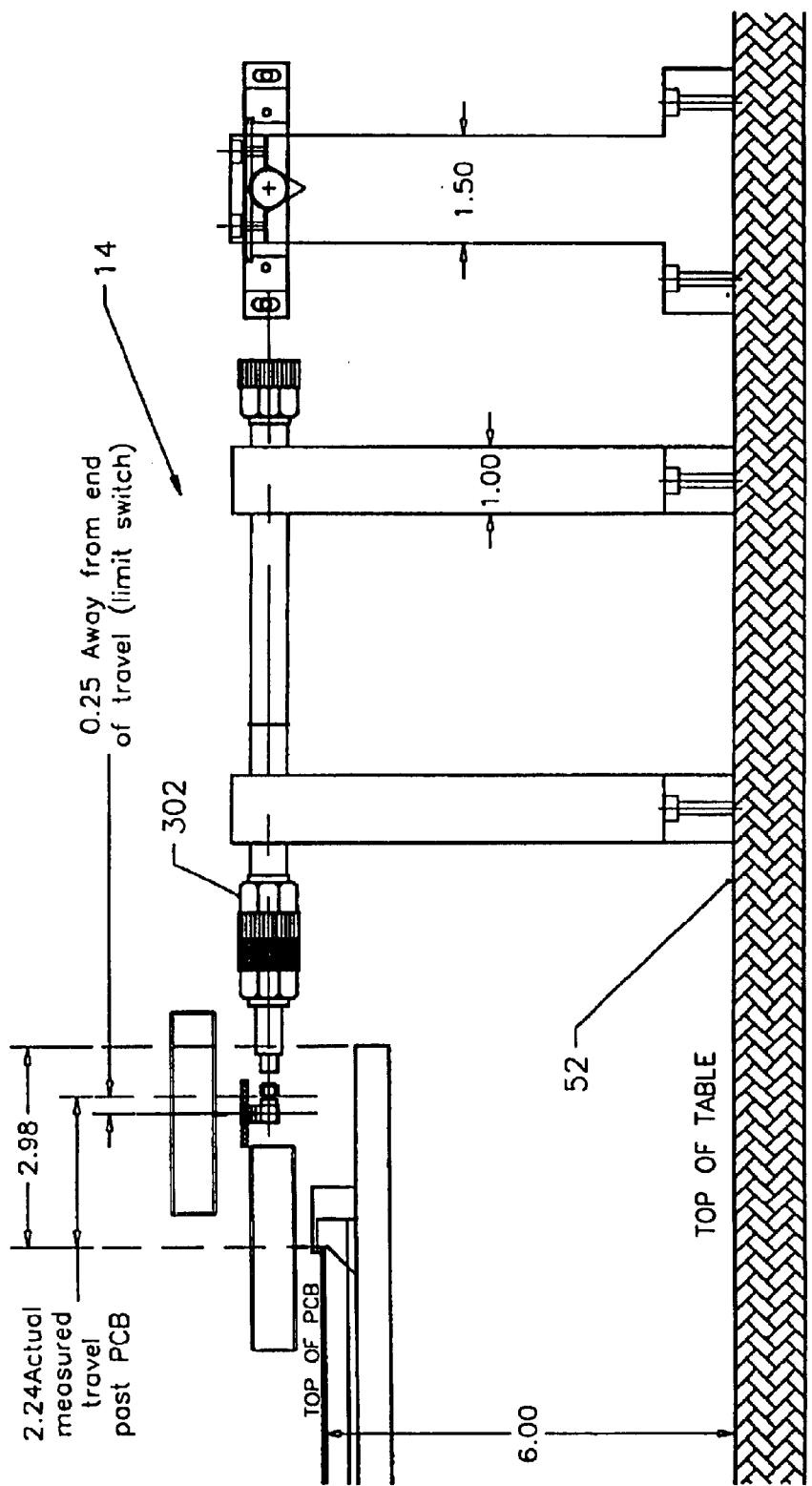
FIG. 11 is a side view of the calibration/verification assembly employing a NIST calibrated air line.

The operator can interrupt standard operations of the equipment and request an immediate instrument calibration through the use of a Instrumentation Self-Calibration menu command. Alternately the operator can setup a time interval (or number of measurements) between instrument calibration. The setup is accomplished on an Instrumentation Self-Calibration menu command display. Referring to FIG. 11, the preferred calibration/verification station 14 comprises a resistive standard 302 (such as a NIST 50 or 28 ohm airline) which is mounted in a fixture located within the probing envelope of the robot. This airline is mounted in such a configuration to allow the probe assembly to engage onto it and make the appropriate physical connection to allow a calibration measurement to be taken. Significant measured deviation is flagged as an error or small measured deviation is recorded and used to normalize future data until the next calibration.

The operators station should continuously update a display screen which reports the progress of the processing. Information such as the following should be available:
Process monitoring display screen
Current test point test result (in ohms)
Current board test results (in ohms)
Number of boards in loading buffer (if automatic loading/unloading used)
Go/No-go parameter (ohms)
Board Serial Number (if available)
Board Tag (Name)
Time and Date
Time since last Instrumentation calibration
Error Boxes (Fatal-Requires Operator Intervention)
Load Buffer Empty (if automatic loading/unloading used)
Unload Buffer Full (if automatic loading/unloading used)
Instrument Not Reading—Check Probe Assembly and Instrument
Conveyor Stopped, Board Jam—Clear Jam from Conveyor
Probe Outside Calibration Tolerance—Check Probe Assembly
Robot Failed to Reach Desired Target—Check robot and Reset
Instrument Not Responding—Check Instrument and Interface and Reset Interface
Error Boxes (Warning)
Board (Serial #) Measurement outside Tolerance—Board Tested Bad
Board Orientation Not Correct—Board Not Tested A live camera image of the probe contacting the board is preferably provided on a video monitor. This image will allow the operator to confirm that probing is in process and allows the operator to visually inspect the mechanical placement of the robotic head in real time. The imaged display could alternately be the fiducial finding camera assembly.

If panels consist of multiple boards and there are more that one measurement per board, throughput can be increased by fixing two or three probes on the robot end of arm, although use of multiple probes is not preferred.

There are preferably at least two (2) emergency stop controls located strategically around the equipment to allow immediate stopping of the equipment. These controls should initiate the emergency stop at the hardware level (direct hardware input into the robot controller).

The robot assembly employed must quickly, accurately and repeatability move the DR Probe Assembly(s) onto the board under test, which are within the skill of one of ordinary skill in the art. The robot will make anywhere from one (1) to twenty-five (25) (or more) moves per board and will also be required to move to a calibration/verification station upon operator command or at the completion of a predefined number of cycles. The robot moves can be characterized as follows:

1) X, Y, Z and Theta movement.
2) Point-to-point.
3) Index to position over board under test (board is flat) and engage probe assembly down onto board.
4) Working envelope includes moving the probe assembly onto boards with a maximum dimension of 38"×28"; a home position, a calibration/verification station position.
5) The point to point total move time is preferably 0.3 secs or less for a linear move of 12" and including extend/retract from board.
6) Repeatability is preferably within +/−0.01 mm (+/−0.0004 inches) in X, Y, and Z.

The preferred robot assembly comprises a four-axis robot that provides for rotation of the probe assembly to allow testing of all orientations of test pads. A working envelope of 1000 mm (39.3 inches)×750 mm (29.5 inches) is preferred with 360 degree rotation and extend/retract capability of 225 mm (8.9 inches). A travel velocity of at least 65 inches/sec is preferred. A horizontal mounting is preferred to allow easier manual loading/unloading of boards to be tested. Such a configuration also permits inclusion of the standard Surface Mount Equipment Manufacturers Association ("SMEMA") conveyer standard interface to allow third party automatic load/unload equipment to be incorporated.

When a board under test contains serialized data, this data should be read from the board and stored. The physical read head location should be configurable to allow the reading of bar codes that may be located in various positions on the panel (board) under test. Ultimately the data will be available to Operators Station for transfer to a user's Statistical Process Control (SPC) system. The bar code scanner preferably has an RS-232 interface and sends raw alphanumeric data followed by a <CR>. Conventional laser pattern scanners allow reading of a bar code label that is placed at any angle (0–90 degrees) and within an eight (8") inch radius.

Optionally, a marking system can be incorporated into the system whereby each individual good board (board could be in panel form) will be marked "good" in a manner suitable to the manufacturer.

The DR probe assembly of the invention includes all components from the DR module to the probe tip. This assembly is designed to maximize measurement accuracy. Preferably, the assembly includes the following: (1) high-frequency connectors (SMA, SMC, 3.5 mm); (2) semi-rigid coaxial cable; and (3) multiple fixed-pitch probe/ground assemblies (determined by the spacing of the test pads on the board under test) such as a set of three having 0.100", 0.050", 0.025" pitches.

The System Controller is preferably a Windows based PC (98 or NT) or other computer and provides the following functionality: (1) Graphical User Interfaces (GUIs) for both operator and configuration and maintenance functions; (2) Equipment Controller; and (3) Interface to the user's Statistical Process Control (SPC) system to pass test results (serialized or unserialized). The Equipment Controller preferably includes the following hardware, in addition to basic components of a network server: (1) GPIB or HP-IB card or the like to interface to DR instrumentation; (2) Interface hardware to facilitate communications to the user's SPC system; and (3) an optional Touch Screen Display for basic operator functions. The Controller Software preferably includes: Database functions to store and retrieve board XY and impedance data files; (2) Database functions to store and retrieve test results; (3) optional Bar Code Reader software with RS-232 Interface; (4) optional Marking System (marks board with good/bad designators); (5) interface to Measurement Instrumentation; (6) interface to user's SPC system to transfer test results; (7) Operator Controls interfaces, such as for a) selection of number of equipment measurement cycles before re-calibration of the DR measurement system, b) selection from stored database of board type to be run, c) Emergency Stop controls, d) Bar Code Reader active or not, and e) Marking System active or not; and (8) Configuration and Maintenance Controls interfaces, such as for a) data entry into database of board information, b) Teach/Calibration of robot to board location, and c) Home (Re-initialize) Robot.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A robotic domain reflectometry test system comprising:

domain reflectometry instrumentation;

a robotic arm; and a passive, high frequency probe assembly comprising a signal probe and a ground probe having a fixed, non-adjustable pitch, said probe further comprising a controlled impedance, said probe assembly being electrically connected to said domain reflectometry instrumentation, and being movable by said robotic arm in an X, Y and Z axis for placing and retracting said signal probe and said ground probe from test points on an unloaded printed wiring board (PWB), said domain reflectometry instrumentation and said probe assembly configured to measure impedance values of said test points on said PWB.

2. The system of claim 1 additionally comprising a probe assembly changing station accessible by said robotic arm, said probe assembly changing station comprising holders for a plurality of probe assemblies, each probe assembly from the plurality of probe assemblies comprising a different predetermined pitch.

3. The system of claim 2 additionally comprising a robotic control system comprising means for directing said robotic arm to acquire from said probe assembly changing station a probe assembly having a correct predetermined pitch for test points having a same pitch.

4. The system of claim 1 wherein said system can test traces having a length of between approximately 0.5 inches and 150 feet such that a standard deviation of domain reflectometry test result impedances is 0.03 ohms or less.

5. The system of claim 1 wherein said probe assembly mimics electrical characteristics of a coaxial structure.

6. The system of claim 1 wherein said system can test components comprising dimensions of between approximately 5.25 inches×0.5 inches and 36 inches×28.5 inches.

7. The system of claim 1 additionally comprising a robotic control system comprising means for automatically planning testing of the test points by importation of computer aided design data for the test points.

8. The system of claim 1 wherein said system records impedance and propagation delay and calculates a dielectric constant for each test point.

9. A probe assembly changing station for a robotic domain reflectometry test system, said station being accessible by a robotic arm of said system, and said station comprising holders for a plurality of passive, high frequency probe assemblies, each probe assembly comprising a different pitch between a signal probe and a ground probe and further comprising a controlled impedance, said probe assemblies affixable to a test head of the robotic arm and from which the robotic arm can affix any of the plurality of probe assemblies on the test head and locate the probe assembly in an X, Y and Z axis and automatically and accurately place said signal probe and ground probe on traces on an unloaded PWB.

10. The probe assembly changing station of claim 9 wherein each of said probe assemblies comprises a passive, high frequency probe assembly comprising a signal probe and a ground probe having a fixed, non-adjustable pitch.

11. A robotic domain reflectometry test system comprising:
- domain reflectometry instrumentation;
- a robotic arm;
- a passive, high frequency probe assembly comprising a signal probe and a ground probe, said probe assembly being electrically connected to said domain reflectometry instrumentation said probe further comprising a controlled impedance, and being movable by said robotic arm in an X, Y and Z axis for placing and retracting said signal probe and said ground probe from test points on a trace of an unloaded PWB;
- means for recording impedance and propagation delay for each test of the test points and means for calculating and recording a dielectric constant for each test of the test points.

12. A robotic domain reflectometry test method comprising the steps of:
- providing to a robotic arm a passive, high frequency probe assembly comprising a signal probe and a ground probe having a fixed, non-adjustable pitch said probe assembly comprising a controlled impedance, the probe assembly being electrically connected to domain reflectometry instrumentation; and
- moving the probe assembly in an X, Y and Z axis for placing and retracting the probe assembly from test points on an electrical component via the robotic arm.

13. A robotic domain reflectometry test method comprising the steps of:
- providing within reach of a robotic arm a probe assembly changing station comprising holders for a plurality of passive, high frequency probe assemblies, said probe assembly comprising a controlled impedance, each probe assembly comprising a different pitch between a signal probe and a ground probe;
- without human intervention affixing to a test head of the robotic arm a selected probe assembly from the plurality of probe assemblies; and
- maneuvering and the selected probe assembly in an X, Y and Z axis and automatically and accurately placing the selected probe assembly's signal probe and ground probe on test points.

14. A robotic domain reflectometry test method comprising the steps of:
- providing to a robotic arm a passive, high frequency probe assembly comprising a signal probe and a ground probe, said probe assembly comprising a controlled impedance, the probe assembly being electrically connected to domain reflectometry instrumentation;
- maneuvering the probe assembly via the robotic arm;
- electrically connecting the probe assembly to, and retracting the probe assembly from test points on an electrical component to be tested; and
- recording impedance and propagation delay for each test of the test points and calculating and recording a dielectric constant for each test of the test points.

* * * * *